United States Patent
Ross et al.

(10) Patent No.: US 9,468,136 B2
(45) Date of Patent: Oct. 11, 2016

(54) LOW VOID SOLDER JOINT FOR MULTIPLE REFLOW APPLICATIONS

(71) Applicant: Indium Corporation, Clinton, NY (US)

(72) Inventors: Jordan Peter Ross, Whitesboro, NY (US); Amanda Hartnett, Utica, NY (US); Robert Norman Jarrett, Clinton, NY (US)

(73) Assignee: Indium Corporation, Clinton, NY (US)

( * ) Notice: Subject to any disclaimer, the term of this patent is extended or adjusted under 35 U.S.C. 154(b) by 23 days.

(21) Appl. No.: 14/157,352

(22) Filed: Jan. 16, 2014

(65) Prior Publication Data

US 2014/0193658 A1  Jul. 10, 2014

Related U.S. Application Data

(63) Continuation-in-part of application No. 13/483,376, filed on May 30, 2012, now Pat. No. 9,010,616.

(51) Int. Cl.
| | |
|---|---|
| *B23K 20/22* | (2006.01) |
| *B23K 35/00* | (2006.01) |
| *H01L 21/50* | (2006.01) |
| *H05K 13/04* | (2006.01) |

(Continued)

(52) U.S. Cl.
CPC ........... *H05K 13/0465* (2013.01); *H01L 21/50* (2013.01); *H01L 23/10* (2013.01); *H01L 23/36* (2013.01); *H01L 23/3736* (2013.01); *H01L 24/27* (2013.01); *H01L 24/29* (2013.01); *H01L 24/83* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/16225* (2013.01); *H01L 2224/2711* (2013.01); *H01L 2224/27334* (2013.01); *H01L 2224/29012* (2013.01); *H01L 2224/29015* (2013.01); *H01L 2224/29016* (2013.01); *H01L 2224/29018* (2013.01); *H01L 2224/29109* (2013.01); *H01L 2224/32225* (2013.01); *H01L 2224/32245* (2013.01); *H01L 2224/73204* (2013.01); *H01L 2224/73253* (2013.01); *H01L 2224/81815* (2013.01); *H01L 2224/83001* (2013.01); *H01L 2224/8314* (2013.01); *H01L 2224/8321* (2013.01); *H01L 2224/83075* (2013.01); *H01L 2224/83136* (2013.01); *H01L 2224/83439* (2013.01);

(Continued)

(58) Field of Classification Search
CPC ............. H01L 2924/01049; H01L 21/50; H01L 24/29; H01L 2224/81815; H01L 2224/83075; H01L 2224/838; H01L 2224/83815; H01L 2224/92225; B23K 1/20; B23K 35/001; B23K 1/0008
See application file for complete search history.

(56) References Cited

U.S. PATENT DOCUMENTS

| | | | | |
|---|---|---|---|---|
| 6,489,879 | B1 * | 12/2002 | Singh et al. | ............. H01C 1/08 337/153 |
| 2003/0173051 | A1 * | 9/2003 | Rinella | ................ B22D 17/007 164/113 |

*Primary Examiner* — Erin Saad
(74) *Attorney, Agent, or Firm* — Sheppard Mullin Richter & Hampton LLP

(57) ABSTRACT

Methods and apparatus are provided for attaching a heat spreader to a die and includes disposing a solder thermal interface material between a first surface of a die and a first surface of a heat spreader without disposing a liquid flux between the die and the heat spreader to form an assembly, wherein at least one of the first surface of the die and a first surface of the heat spreader have disposed thereon a metallization structure comprising a transition layer and a sacrificial metallization layer, the sacrificial metallization layer disposed as an outer layer to the metallization structure adjacent the solder thermal interface material; and heating the assembly to melt the thermal interface and attach the die to the heat spreader.

37 Claims, 13 Drawing Sheets

(51) Int. Cl.
  *H01L 23/00* (2006.01)
  *H01L 23/36* (2006.01)
  *H01L 23/373* (2006.01)
  *H01L 23/10* (2006.01)
(52) U.S. Cl.
  CPC ............... *H01L 2224/83444* (2013.01); *H01L 2224/83447* (2013.01); *H01L 2224/83455* (2013.01); *H01L 2224/83815* (2013.01); *H01L 2224/92125* (2013.01); *H01L 2224/92225* (2013.01); *H01L 2924/00011* (2013.01); *H01L 2924/01322* (2013.01); *H01L 2924/01327* (2013.01); *H01L 2924/15311* (2013.01); *Y10T 428/12222* (2015.01)

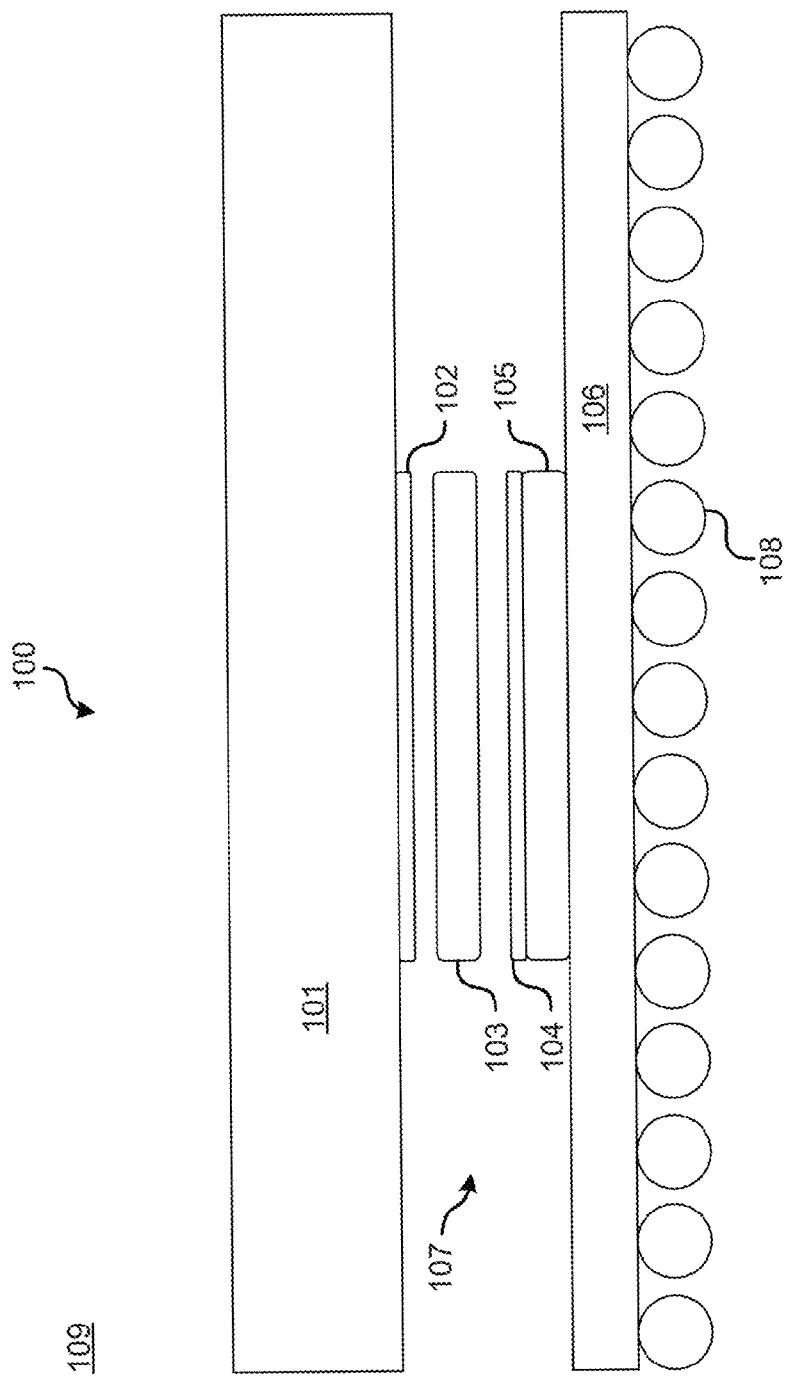

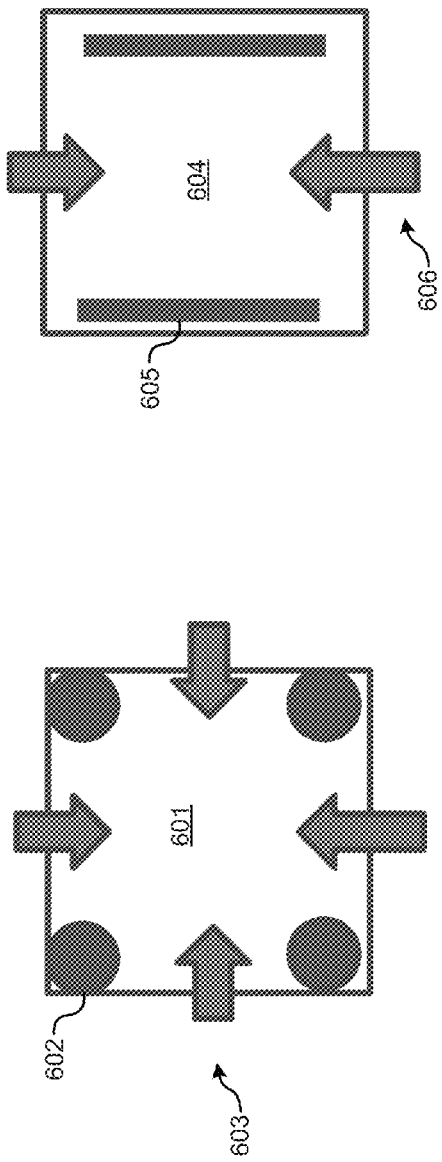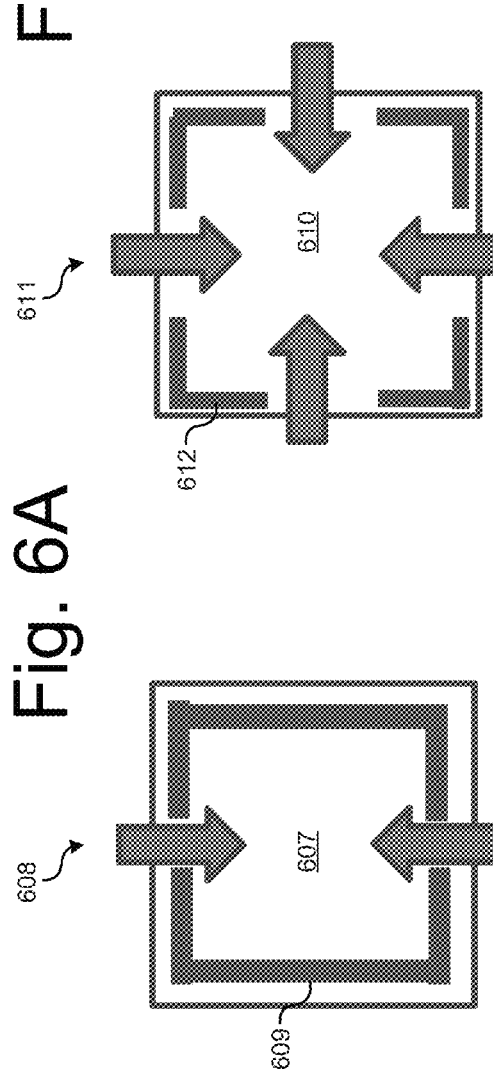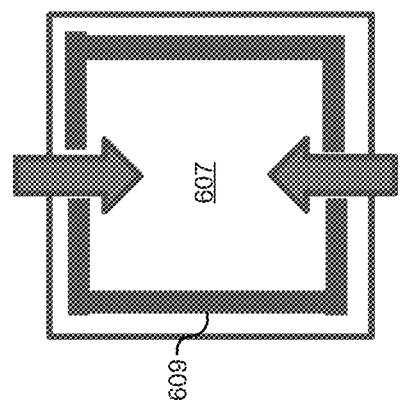

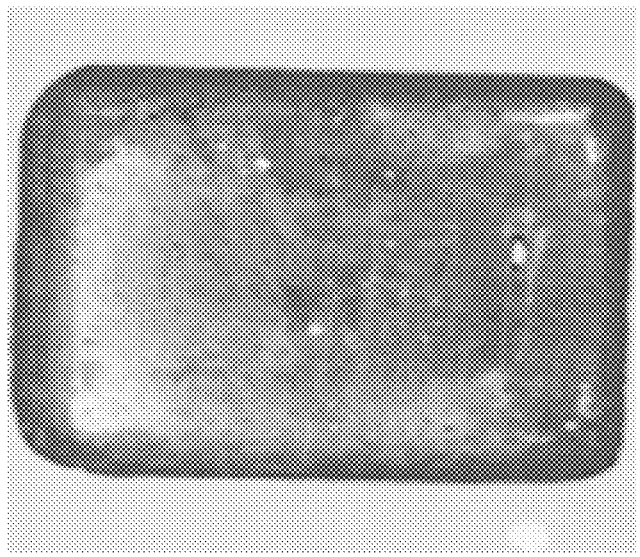
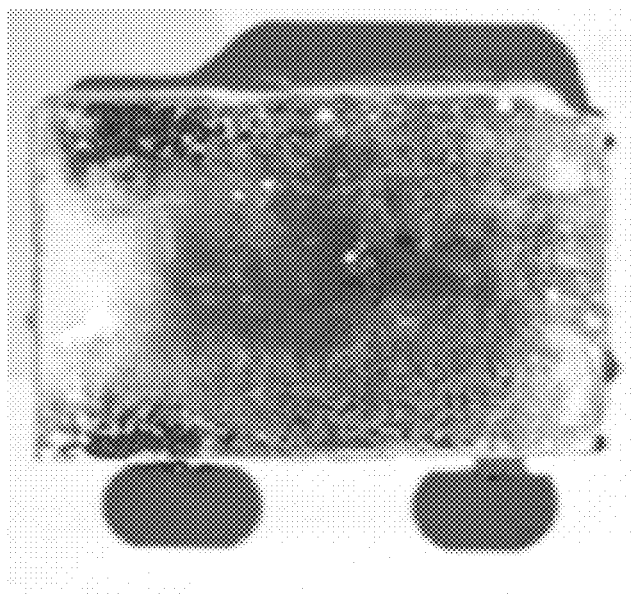
Fig. 8

LOW VOID SOLDER JOINT FOR MULTIPLE REFLOW APPLICATIONS

CROSS-REFERENCE TO RELATED APPLICATIONS

This application is a continuation in part of and claims the benefit of U.S. patent application Ser. No. 13/483,376, filed May 30, 2012.

TECHNICAL FIELD

The present invention relates generally to solder applications, and more particularly soldering without a liquid flux, some embodiments relate to creation of solder joints with low voiding suitable for multiple reflow processes.

DESCRIPTION OF THE RELATED ART

Components such as microprocessors, power amplifiers, microwave generators and similar semiconductor devices, generate considerable ohmic heating while performing the computing or controlling functions. This heating must be removed efficiently at relatively low temperatures to prevent break-down of the semi-conductor circuitry. Although a number of different methods are employed to draw the heat from the semiconducting die, the most effective is achieved by direct conduction through a flat face of the die. In the case of a typical integrated circuit such as a microprocessor, for example, the chip, or die, is connected to a heat spreader through a heat conductive thermal interface positioned between the backside of the chip and the heat spreader.

In today's electronics, a highly conductive interface between the backside of the chip and the heat-spreader is often used and may include an I.H.S or integrated heat spreader or lid. With the progression of more BGA (ball grid array) packages in circuits, there is a problem with the conventional indium solder processes that use a liquid flux as well as with interfaces that are created using a polymer based thermal interface material (TIM) such as a phase change material, gel, thermal grease or polymer solder hybrid.

In the case of epoxies, greases and gels, the low thermal conductivity of the polymer limits its capacity for removing heat. Commercial TIMs are loaded with volumes of flaked metals such as aluminum, copper and silver; conductive ceramics such as alumina, boron nitride and aluminum nitride; and carbon in the form of graphite, nano-particles, nano-tubes and even diamond to boost the conductivity. However, the upper limit of these approaches is ~5 W/m-K conductivity. This becomes a liability when the interface gap prevents forming a uniform and thin bond line. These interfaces often flex and bow considerably during the thermal cycles of processing as well as during service.

However, polymer-based TIMs mechanically adhere to each interface rather than form a physical and chemical bond like a solder does as intermetallics. The purely mechanical bonds that are inherent in polymer TIMs can be an additional trade off because these bonds can also contain voids, which increase thermal resistance of an already low conductivity interface.

Solder is considered a metallic thermal interface material. Metallic interface materials such as solder, by nature have a very high heat conductivity. In the case of indium (IN element 49) the conductivity is 86 W/mK. This is significantly higher than most polymer based TIMs, which typically have a bulk conductivity of 0.5-3 W/mK. In the case of polymer-based TIMs, subsequent reflows also deteriorate the TIM by hardening the polymers, as well as causing bake out of the TIM, or outgassing, which in turn increases thermal resistance of the interface.

In applications where soft solders such as indium or tin alloys are used as the interface material, these solders melt at temperatures low enough to retain the integrity of the die BGA connections. As metals, the conductivities are in the 50-85 W/m-K range. As such they are less sensitive to the bond line thickness variations.

In the solder thermal interface, a metallurgical bond is created between the surfaces. This bond provides both mechanical strength and a continuous path for the conduction of heat. As a metal, the solder TIM, or STIM, uses electrons as the conductive medium, removing the potential for phonon mismatch in cases where the vibration frequency of the substrate material does not couple well with the matrix of the polymer TIM.

This bond is typically developed by prepping the "backside" of the die with bonded layers of metals. First, a reactive metal such as titanium forms a chemical bond with the silicon or other semiconductor. Transition layers of other metals are used to create a solderable surface with a metal such as nickel or cobalt, which can be effectively bonded with a solder. By itself, an exposed nickel surface passivates with a NiO layer, reducing its solderability. For this reason, a layer such as gold or platinum is often flashed onto the surface. This gold-plated nickel is a typical finish of the heat sink mating surface.

In the case of STIM applications, a liquid flux is used to facilitate reflow. The liquid flux is used to remove metal oxides and insure adequate wetting and bonding through intermetallics to the bonding surfaces in contact with the molten solder. The flux chemistry is designed to wet the surfaces of the solder and the surfaces to be joined. During the heating, the surfaces are shielded from oxidation while an organic acid is activated to dissolve and sweep away the thin oxide layer on the solder. The clean metal surface and liquid solder readily wet and form a diffusion bond. If stable intermetallics form between the two metals, the energy of formation assists the bonding.

Alternatively, the components to be joined with solder are placed in an evacuated chamber before heating. Removing the source of oxygen keeps the surfaces clear of oxides during reflow.

When this solder joint is created with a liquid flux, it will have some voids, and those voids often contain liquid flux residue. When this liquid flux created solder joint goes through subsequent reflows either at the original reflow temperature or elevated temperature, the flux residue is baked and volatized, which in most cases causes bigger voids and void propagation. It is for this reason that solder joints created with a liquid flux generally are not used on multiple reflow applications, such as chips with an I.H.S or chips using BGA for subsequent solder attachment to a PCB.

Voids are significantly less thermally and electrically conductive than metallic solder and impair the efficiency and quality of the TIM. Liquid flux is also an issue because liquid flux materials are likely corrosive unless it is cleaned after reflow. In the case of soldering with a simple acidic vapor, no cleaning is necessary and no corrosive residue is left on the substrate or in the solder, assuming the boiling point of the formic or acetic acid has been reached at some point within the profile.

The vacuum soldering solves much of the difficulty of voiding in the solder interface by drawing out any gas trapped in the solder on at the interface. However, the vacuum processes often have manufacturing throughput limitations as small batches of components are loaded in the chamber and evacuated, heated, flowed and cooled.

For several years, processes using gaseous organic acid (formic or acetic) as a replacement solid or liquid flux have been investigated. In this process, the soldering is performed in the oven after it is purged with nitrogen or argon to displace any oxygen. A small amount of the formic acid is introduced to create a reducing environment. This forming gas is capable of reducing oxides on the metal surfaces such as tin and indium oxide on the solder and copper and silver oxides on the surfaces to be soldered.

BRIEF SUMMARY OF EMBODIMENTS OF THE INVENTION

Embodiments of the technology disclosed herein use fluxless soldering in an in-line oven, which forms a robust solder thermal interface capable of remaining essentially void-free through multiple reflow cycles. This technology can use a sacrificial silver metallization rather than gold. The result is a solder joint bonded directly to the underlying nickel without the brittle layer of an $In_2Au$ intermetallic compound.

The combination of formic acid fluxless soldering and the use of silver as the metallization enable this process. Silver forms a eutectic alloy with indium at a level of 3% indium. When liquid indium from the solder TIM contacts the silver it immediately wets and quickly dissolves the silver. In this application, the leaching of the silver allows the indium to solder to the underlying nickel. The In—Ni solder joint is very stable with a slow-growing intermetallic layer.

This type of reaction also occurs in the gold metallized interface; except that indium doesn't dissolve in the gold and instead forms a very stable Au-In intermetallic compound. The coarse, blocky, brittle Au—In IMC remains lodged at the interface and is the weakest link of the interface joint. In the conventional gold metallized assemblies, the solder forms a boundary of $AuIn_2$ intermetallic, which has a solution temperature much higher than the soldering temperature. This acts as dam, preventing the solder from expanding outward. Excess metal in the bond line bulges out of the joint and eventually forms a droplet which spills on to the substrate. This volume of metal is lost to the bond line for subsequent melting cycles.

For the multiple reflow application, the silver metallization on the heat spreader plays the role of a reservoir of filler for the bond line. The liquid indium in contact with silver initially seeks to form the In—Ag IMC. This is quickly dissolved in the indium, lowering its melting point to from 157° C. to the In—Ag eutectic of 143° C. This low melting eutectic assists the spreading of the wetted surface providing a mobile source of liquid solder during each melting cycle.

With the gold metallization, indium only wets to the original edge of the solder shape. Any excess indium flows out of the interface and spills over the edge of the chip. In the inspection images, this appears as a tongue of metals. The volume lost in this spillage is not available for conforming to the movement of the interface during the reflow operations. Any additional metal disturbed from the interface adds to the spill each thermal cycle.

In the formic acid environment, the silver oxide tarnish that accumulates is reduced to a state that readily can be soldered. The dissolving silver metallization can be applied to both interfaces for optimal bonding. However, the lid surface is the more critical one. On that surface, a reservoir of solder forms to fill the bond line on subsequent reflows. This reservoir is supported by the wetting of the solder to silver interface.

The pool of liquid solder that forms at the edge of the silver metallized interface is actively wetting the silver with the lower melting eutectic alloy present at the leading edge of the interface. With this area larger than the die, a controlled volume of liquid solder is available to flow back into the bond line as the gap opens due to the thermal cycle. Without the reservoir, this opening can lead to formation of a void, or enlargement of an existing void in the bond line.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 1A illustrates an assembly stack and layers according to an embodiment of the invention.

FIGS. 6A-6D illustrate various dispensing patterns for applying a curable lid material to substrates in accordance with embodiments of the invention.

FIG. 8 provides ultrasonic images comparing silver and gold sacrificial metallization layers.

Figure 1B:
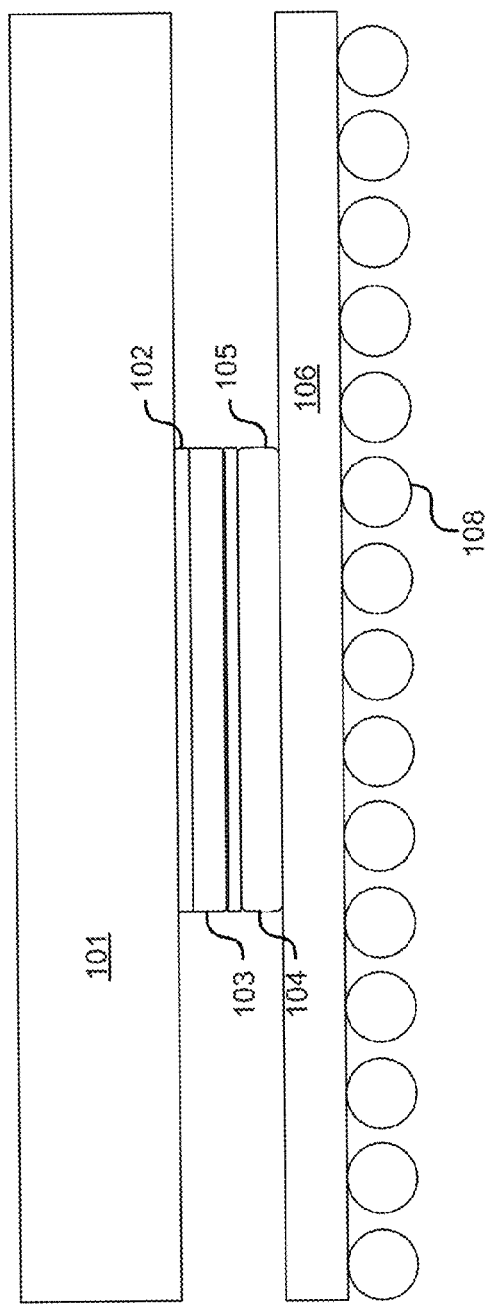
FIG. 1B illustrates a bonded assembly implemented in accordance with an embodiment of the invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

According to various embodiments of the invention, a method is provided for the forming of a metallic solder joint without a liquid flux to create a solder joint that has minimal voids and can be reflowed multiple times without void propagation. This process can be done for any solder alloy, and is most specifically used in the application of first level thermal interface (TIM1) in an IC or micro processor or BGA microprocessor.

FIG. 1A illustrates an assembly stack and layers according to an embodiment of the invention. The stack 100 comprises a heat spreader, integrated heat spreader, or lid 101 (collectively referred to as a "heat spreader" or "spreader"). A solderable surface 102 is disposed on the underside of the heat spreader 101. In some embodiments, the solderable surface 102 comprises a Ni, Ag, Cu, or other common solderable surface such as Electroless Ni Immersion Gold (ENIG). In some cases, Ni can be a difficult surface to solder, so a sacrificial barrier layer of gold flash oxide barrier is often put on the heat-spreader for conventional soldering with a liquid flux. In some embodiments, a gold or silver oxide barrier layer on the surface 102 may not be necessary when soldering with a simple carboxylic acid vapor if an acceptable void criteria is met. In further embodiments, a gold or silver barrier layer may be applied to the surface 102—for example, for minimal void levels.

The assembly 100 further includes a substrate 106 attached to a processor die 105. For example, the die 105 may have been attached up stream in a flip chip solder assembly in which solder bumps are reflowed but then encapsulated in an underfill or epoxy. In other embodiments, other conventional methods of attaching the processor die 105 to the substrate 106 may be employed. In some embodiments, a plurality of solder bumps 108 are disposed on the bottom surface of the substrate 106. The processor die 105 has a second solderable surface 104 on its backside. In some embodiments, the solderable surface 104 comprises a metallization layer on the chip side of the interface. For example, although solder may wet to the chip 105, an inter-metallic layer is often preferred.

The assembly 100 further comprises a solder preform 103 disposed between the two solderable surfaces 102 and 104. The preform 103 and assembly 100 are configured to provide a path 107 from the exterior of the assembly to the interface between the preform 103 and the surfaces 102 and 104. During reflow, a simple carboxylic acid vapor, such as formic vapor, is present in the reflow chamber 109. The path 107 provides access for the vapor to reach the preform 103 and interfaces. The vapor is used to dissociate the oxide layer during the reflow operation, breaking the metal-oxide bond to bond the free metallic stack together. In some embodiments, the reflow chamber 109 may be a chamber of an inline conveyor oven. In other embodiments, any type of soldering oven may be employed. In further embodiments, the solder preform 103 may be replaced or supplemented with a solid volume of solder dispensed onto one or both of the contacts 102, 104.

In some embodiments, the assembly comprises a plurality of solder contact points 108 disposed on the underside of the substrate 106. In some embodiments, the plurality of solder contact points 108 comprises a grid of solder contact points coupled to metalized contacts. The solder contact points may comprise solder balls, spheres, columns, bumps, or any other solder contact point used in IC attach. In some embodiments, the solder contact points 108 are present on the assembly 100 prior to solder the preform 103. In other embodiments, the solder contact points 108 are provided after the heat spreader 101 is attached to the die 105 and substrate 106.

FIG. 1B illustrates the assembly in the bonded state. The assembly resulting from the illustrated stack comprises a die 105 bonded to the I.H.S. 101 through a solder thermal interface 103. Because a solder paste is not used, and simple carboxylic acid vapor is used to dissolve the oxide layer, there is no liquid flux residue in the assembly. The preform solder in its solid state establishes the bondline for the assembly during the lid-attach process. Accordingly, the resultant assembly can go through subsequent reflow processes without out gassing or other defects typically found in subsequent reflows of solders applied with liquid flux. Accordingly, solder 103 can be a low temperature solder, such as indium, or an indium alloy, even if the assembly will be subjected to subsequent high-temperature reflows. The substrate 106 may therefore be a BGA that can be attached to a board with a later, higher-temperature reflow process, for example, using a lead-free solder.

Some force applied to the interface during reflow can help to ensure a good solder joint. However, too much force can squeeze all solder 103 out of the interface. In some embodiments, a fixture or clip can be used to create a standoff during reflow. When a solder reflows, it melts and turns to liquid. Therefore, if a heat spreader 101 is resting on top of the preform 103 when it melts it may squeeze all the solder out of the interface. A fixture can be created to push down on the spreader slightly but a fixture can also be applied to the interface gap to make sure that a defined bondline is formed. In some embodiments, the fixture may remain as part of the chip package, to prevent disruption of the TIM interface during subsequent reflows. The solid preform 103 can also be used to create the stand-off gap during lid attach process. Before the solder preform 103 is melted, the assembly can go through a prep lid seal cure process.

Figure 1C:
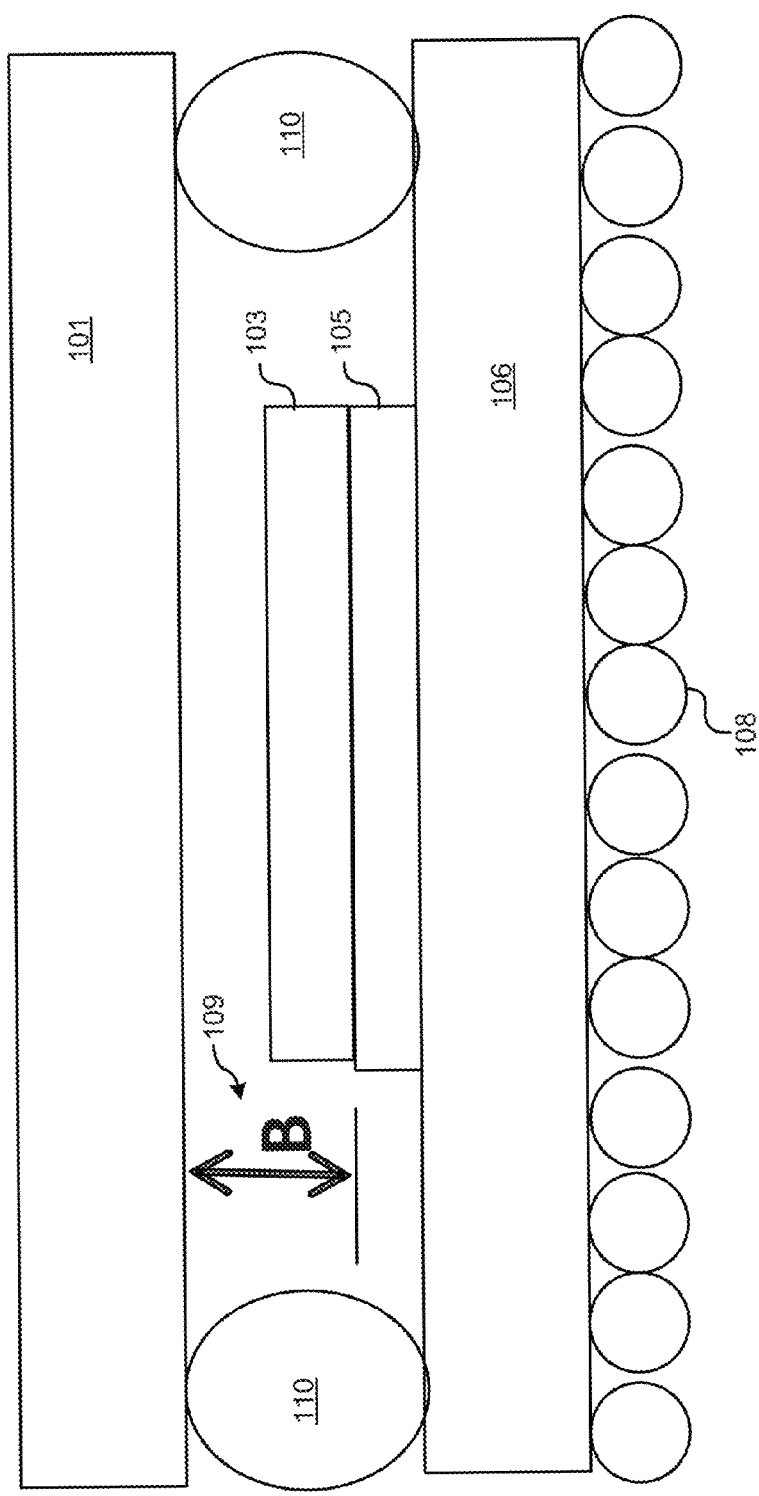
FIG. 1C illustrates an embodiment of the invention employing a pre-soldering lid cure.
Figure 1D:
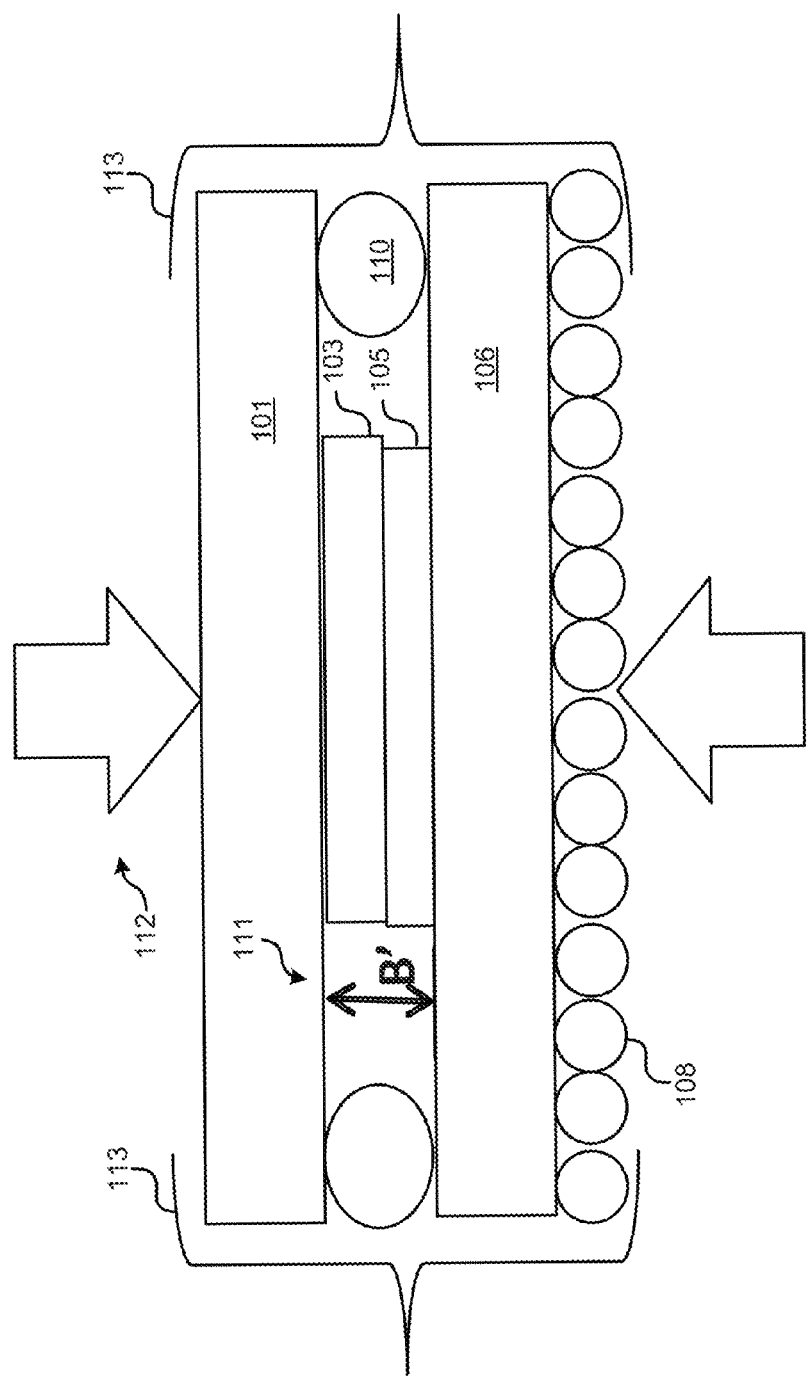
FIG. 1D illustrates the embodiment of FIG. 1C after lid cure.

FIGS. 1C and 1D illustrate the assembly during various stages of a prep lid seal cure process implemented in accordance with an embodiment of the invention. In FIG. 1C, a lid seal material 110 has been dispensed between the heat sink 101 and the substrate 106. The lid seal material 110 is dispensed such that a gas pathway is maintained from the environment to the preform 103 and die 105. For example, FIGS. 6A-6D below illustrate various patterns for dispensing the lid seal material 110. The lid seal material 110 is slightly thicker than the die 105 and preform 103, establishing a bondline B 109 between the heat sink 101 and the upper surface of the die 105.

In FIG. 1D, one or more clips 113 have been applied to the assembly. The clips 113 force 112 the heatsink 101 and substrate 106 together. This compresses the lid seal material 110 and forces the preform 103 to contact the heatsink 101. This establishes the final bondline 111. Accordingly, the bondline can be established by engineering the preform 103 thickness to desired parameters. With the clips 113 in place, the lid seal materials 110 are cured at a temperature below the melting temperature of the preform 103. After curing, the lid seal materials 110 are substantially incompressible and are bonded to the heat sink 101 and substrate 106. Accordingly, the cured lid seal will fix the heat sink 101 and substrate 106 at the bondline distance 111. Therefore, during reflow, the preform 103 is not under pressure, and will not flow off of the die 105. In further embodiments, other systems for applying pressure to the assembly during lid cure may be employed. Additionally, during reflow, the clips 113 may be removed to reduce thermal mass or may be left in place without impacting the soldering process.

Figure 1E:
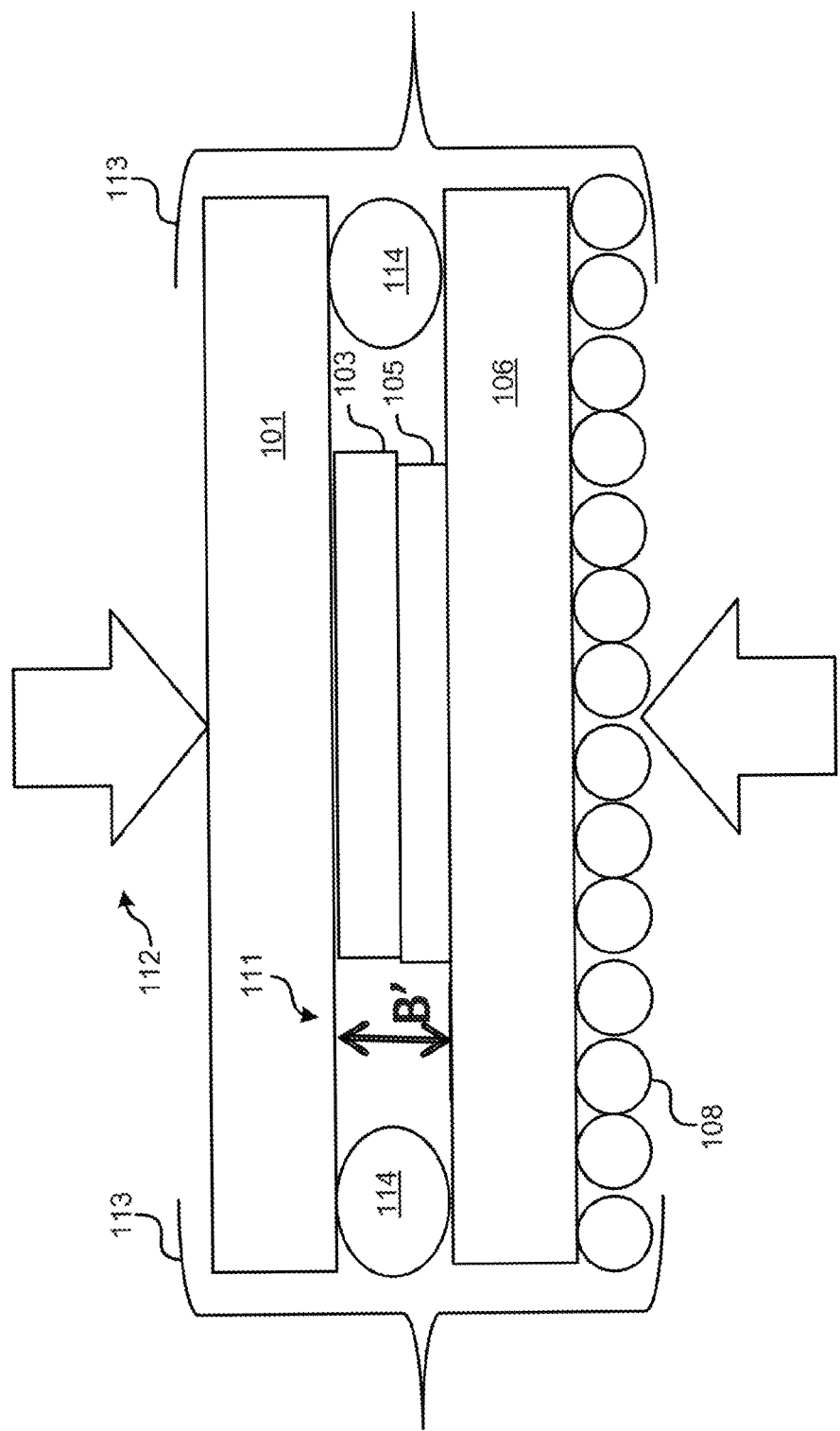
FIG. 1E illustrates an embodiment of the invention employing a fixture for establishing a bondline during reflow.

In other embodiments, the heat spreader 101 may not be attached to the substrate 106 using a lid seal process prior to soldering. An embodiment not utilizing a lid pre-cure is illustrated in FIG. 1E. In this embodiment, a shim or other fixture 114 is inserted between the heat spreader 101 and the substrate 106 to establish the desired bondline 111. In still further embodiments, the shim or fixture 114 may be integral with the clip 113.

Figure 2A:
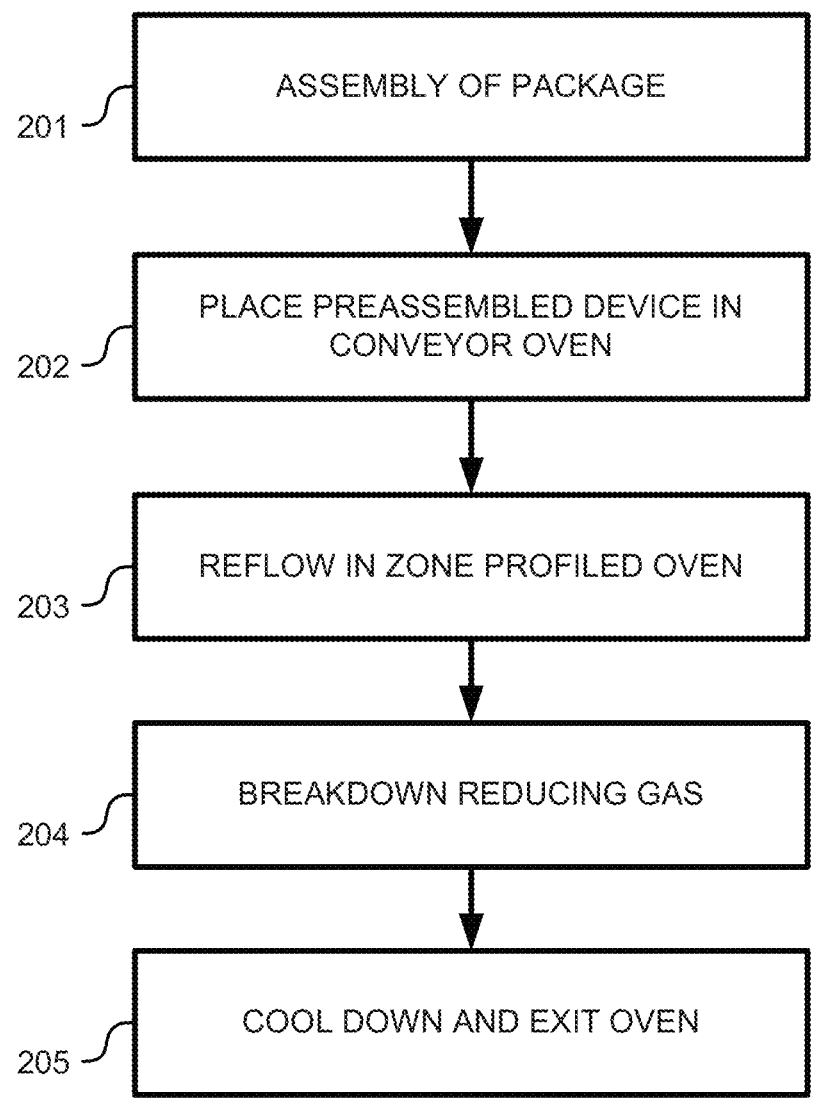
FIG. 2A illustrates a process flow according to an embodiment of the invention.

FIG. 2A illustrates a process flow according to an embodiment of the invention. In step 201, the package is pre-assembled. In some embodiments, the package comprises a substrate with metalized chip, a solder preform and a heat-spreader with solder able metallization and assembly of the package 201 comprises performing the lid cure process described with respect to FIGS. 1C and 1D In step 202, the pre-assembled device is placed in a conveyor oven. In some embodiments, if a pre-cure of lid seal has not been done ahead of time, a weight or force may be placed on the top of the heat spreader to force the heat spreader toward the die. If a pre-cure has not been conducted, the preform thickness may be used as a standoff during lid seal cure. By engineering the thickness of the preform before reflow to be the exact desired bondline, a weight or force can be applied to the heat spreader during head spreader cure. As long as the cure temperature does not exceed the melt point of the solder preform, when the force pushes down on the heat spreader, the spreader will bottom out at the preform height and establish a bondline. The package lid seal will then cure at the bondline thickness so that subsequent reflows will not need a clip and a desired bondline is established.

It is important that the nitrogen and formic acid vapor can reach the solder preform and its interface. In some embodiments, only the corners need to be sealed with a polymer and air gaps or formic vapor pass-through gaps are created. Holes or gaps may also be machined or integrated into the spreader to assist this process.

In step 203, reflow takes place in a zone-profiled oven. In this embodiment, the oven is profiled in zones based on the solder that is used. The zoned oven provides a purging gas and an oxide dissolving vapor or gas. The purging gas provides an inert atmosphere (i.e., oxygen free) in the reflow oven and may comprise nitrogen, or other inert gases, such as argon. The oxide reduction vapor or gas may comprise formic acid vapor or other oxide reducing gases, such as simple carboxylic acid vapors. The reflow process 203 includes a temperature sufficient to breakdown the oxide reducing gas in step 204. For example, at 200° C., formic acid breaks down into carbon monoxide or carbon dioxide and water. If the oxide reducing gas breakdown temperature is below the melting temperature of the preform, the reflow process 203 further includes a temperature zone above the melting temperature of the preform. In some embodiments, pure indium may be employed as the thermal interface material. For pure indium solder joints it is recommended that peak temp of the profile is 200° C. for the liquidus stage. Indium melts at 157° C. but the profile peak reaches 200° C., which in turn reflows the indium and breaks down the acid vapor all in one step. In step 205, the oven enters a cool down zone and after cool-down, the assembly exits the oven. Because the oxide reducing gas has been broken down into gasses during step 204, no residues remain and no cleaning is necessary.

Figure 2B:
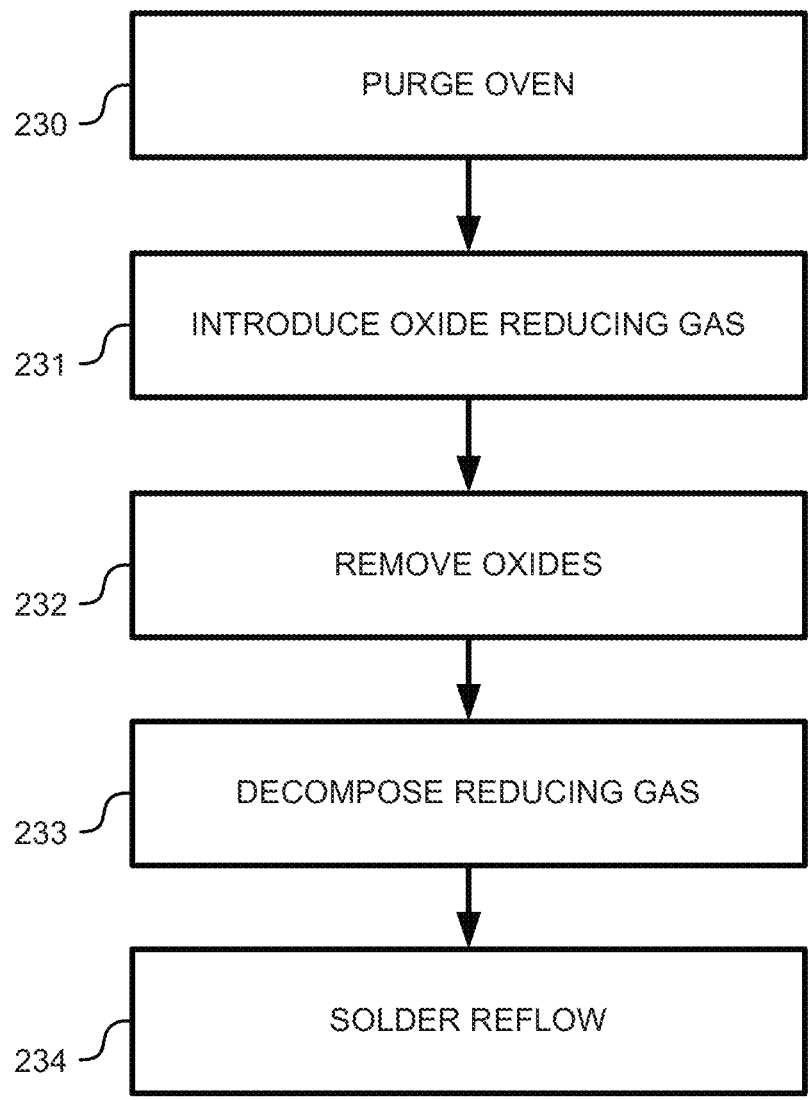
FIG. 2B illustrates a reflow process flow implemented in accordance with an embodiment of the invention.

FIG. 2B illustrates a more detailed process flow for a reflow profile implemented in accordance with an embodiment of the invention. In this embodiment, the reflow process begins at step 230 by purging the oven of oxygen. For example, the oven may be filled with an inert gas such as nitrogen or argon in a conventional manner. Afterwards, at step 231 the oxide removing gas is introduced into the oven—for example, through bubbling or other conventional method. At step 232, the oven is then subjected to sufficient temperatures for a sufficient length of time to remove oxides from the surfaces to be soldered.

At steps 233 and 234, the oven is then subjected to sufficient temperatures to decompose the reducing gas and reflow the solder. In some embodiments, the solder may reflow at a lower temperature than the decomposition of the reducing gas. In other embodiments, the gas may decompose at a lower temperature than the solder. Accordingly, steps 233 and 234 may be performed in either order. Additionally, steps 233 and 234 may be performed simultaneously by heating the oven to a sufficiently high temperature to both decompose the gas and reflow the solder. Afterwards, the oven is cooled down and vented. Because the oxide reducing gas is decomposed into gaseous molecules, no residue remains on the assembly, and there is no need to clean the assembled package.

Figure 3:
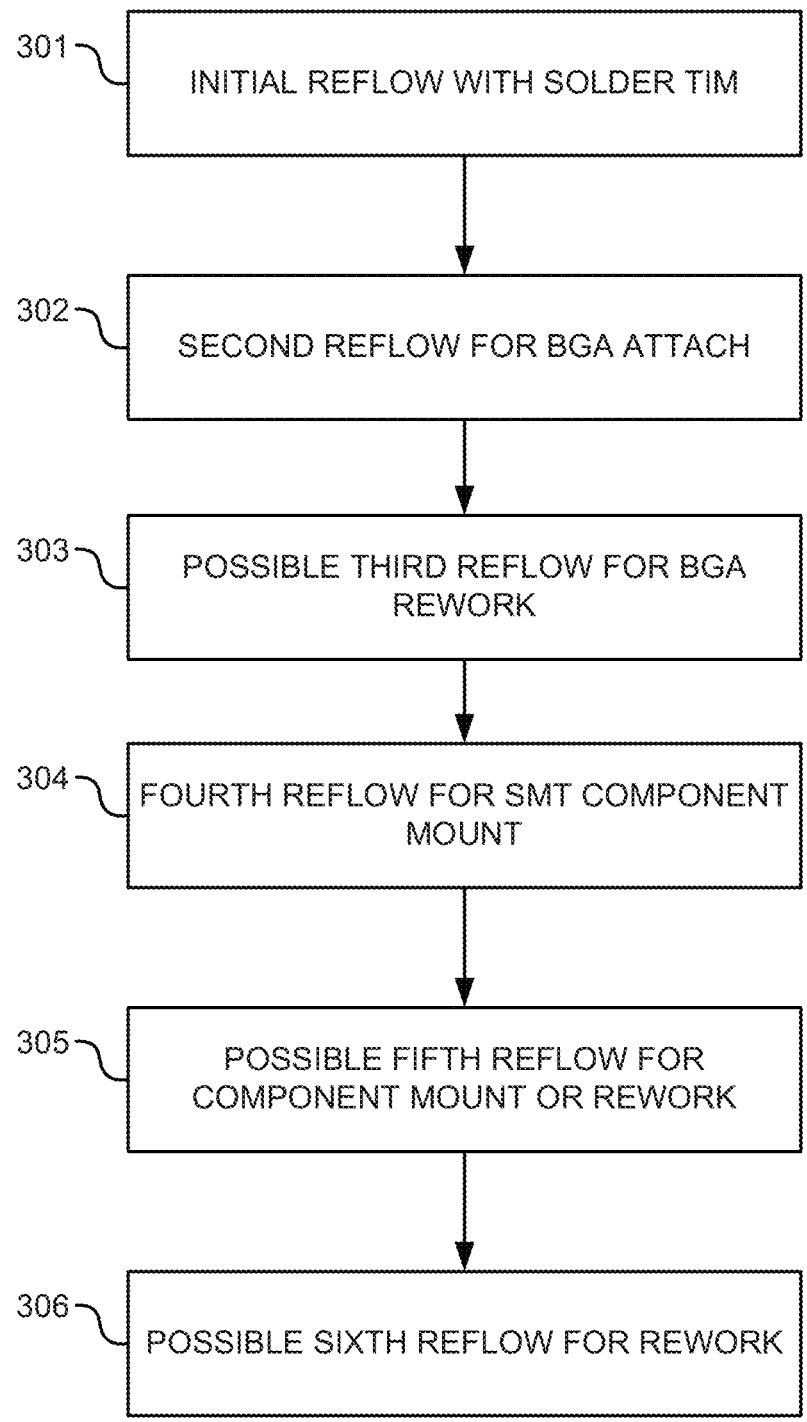
FIG. 3 shows a possible process in which a BGA solder TIM implemented in accordance with an embodiment may be reflowed many or multiple times.

FIG. 3 shows a possible process in which a BGA solder TIM implemented in accordance with an embodiment may be reflowed up to 6 times. A first reflow process 301 forms the solder-based thermal interface to attach the die to the heat spreader. A second reflow process 302 allows the package to be attached to the board using a BGA. A third reflow process 303 may be employed for BGA rework. A third (or fourth if BGA reflow process 303 is performed) reflow process 304 allows surface mount technology (SMT) components to be attached. In some embodiments, a fifth reflow 305 or sixth reflow 306 process may be used for additional component mounting or rework.

Because the initial reflow process 301 employed a process without liquid flux, the subsequent reflow processes 302-306 can be performed at higher temperatures than the initial process 301. For example, the initial reflow 301 may be performed using a pure indium, indium alloy, or other low temperature solder preform while the subsequent reflows 302-306 may be performed with higher temperature solders, such as lead-free solders like tin-silver-copper (SAC) alloys. These further reflow processes may be performed at similar or elevated temperature profiles as the initial reflow 301. For example, when a solder material having a melting temperature of less than 200° C. is used in the initial reflow 301, subsequent reflows may be performed at temperature profiles for reflowing solder contact points that have melting temperatures between 100 and 350° C.

Figure 4:
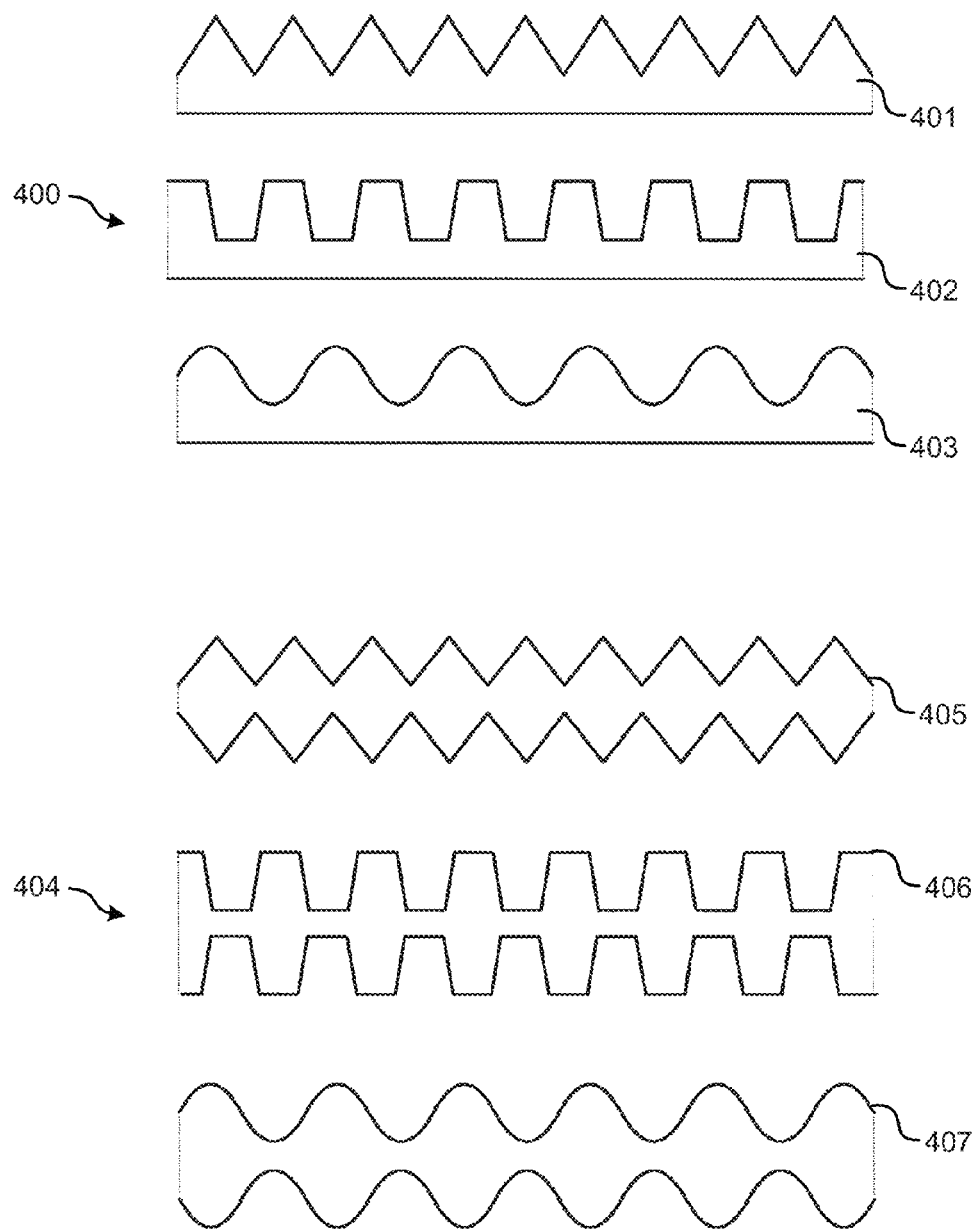
FIG. 4 illustrates some examples of preform textures that may be employed in embodiment of the invention.

As discussed above, to use a solder preform with formic acid vapor for oxide reduction, a pathway for the gas to reach the preform is provided. In one embodiment, a textured solder preform can facilitate the formic acid vapor reaching the entire interface between the preform and metalized regions. The textured foils can be used to allow the formic acid vapor to get under the preform and remove oxides. FIG. 4 illustrates some examples of preform textures that may be employed in embodiment of the invention. Both single sided 400 and double sided 404 preforms may be employed. For example, single sided or double sided preforms, with one side or both sides having saw tooth 401, 405, grooved 402, 406, or sinusoidal 403, 407 patterns may be employed. Further discussion and examples of textured solder preforms are found in U.S. Pat. No. 7,593,228, the contents of which are hereby incorporated in its entirety.

Figure 5:
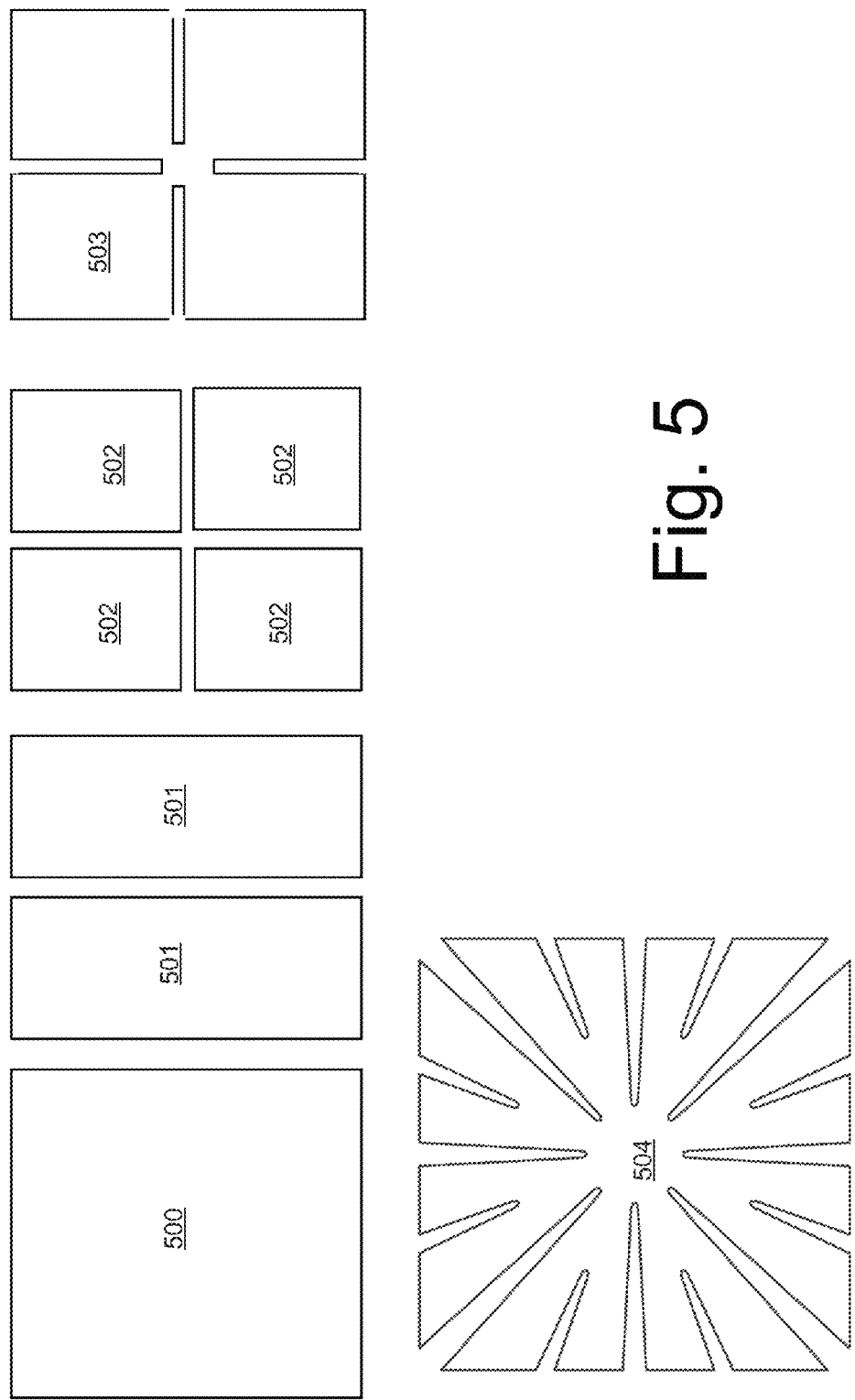
FIG. 5 illustrates examples of multiple preforms and preforms with slits implemented in accordance with an embodiment of the invention.

Another method to allow the formic acid vapor to reach the interfaces to remove oxides is to employ multiple preforms or a preform with slits removed from the preform. FIG. 5 illustrates examples of multiple preforms and preforms with slits in the preforms implemented in accordance with an embodiment of the disclosed technology. Placing multiple preforms side by side and allowing a channel in between them, or slitting the preforms to allow formic acid vapor to reach the interface is another way to increase performance of this application. For metals like Indium that do not wet extremely well, this process may not be helpful, and a single solid preform 500 may be employed. For Sn, Ag or lead containing solders that flow and wet very well, there is no issue with induced voids due to the gap formed by the separation of the two or more preforms. For example: two preforms 501 may be placed side by side with a single channel between them; four preforms 502 may be placed in four quadrants, with two channels formed; a channeled preformed 503 with four channels may be employed, or a multi-channeled preform 504 with varying lengths and locations of channels may be used.

As discussed above, in some embodiments a lid pre-cure process may be performed prior to reflow soldering the heat sink to the die. FIGS. 6A-6D illustrate various example dispensing patterns for the lid seal material. In FIG. 6A, the material 602 is dispensed as beads at the corners of the substrate 601. After cure, this provides air pathways 603 on each side of the substrate 601 for the oxide reducing gas to contact the preform during reflow. In FIG. 6B, two walls of material 605 are dispensed on opposing sides of the substrate 604. This leaves the remaining two sides open 606 for gas to enter the assembly during reflow. In FIG. 6C, the substrate 607 is almost surrounded by material 609. Two sides are completely covered, while gaps are provided in the remaining two sides to allow gas to enter 608 the assembly during reflow. In FIG. 6D, the substrate 610 has four corners of material 612, forming four walls, each having a gap to allow gas to enter 611 the assembly during reflow. In additional embodiments, various other patterns of lid seal material may be applied provided a pathway exists for the oxide reducing gas to enter the assembly during reflow.

Figure 7:
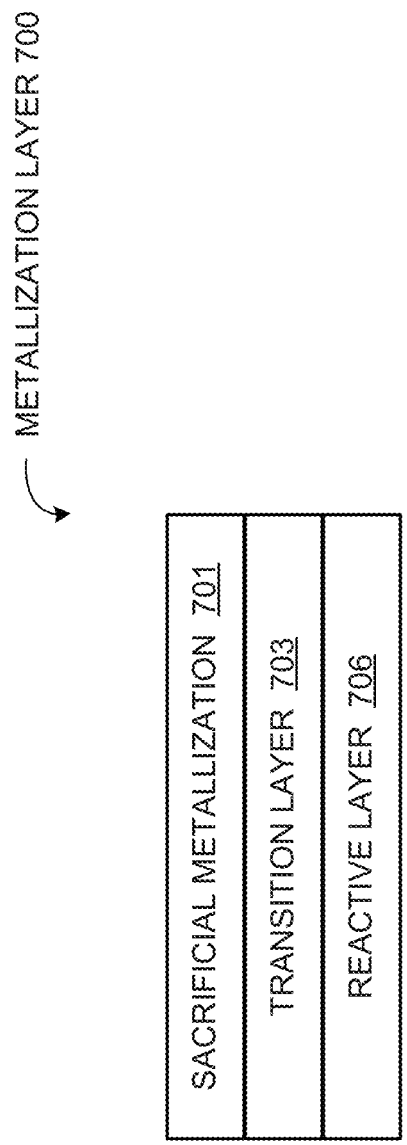
FIG. 7 illustrates an example of a metallization structure that can be provided on either or both of the die and the heat spreader in accordance with one embodiment of the invention.

FIG. 7 is a diagram illustrating an example structure of a solderable surface (e.g., solderable surface 102 or solderable surface 104) in accordance with one embodiment of the technology described herein. As noted above, solderable surfaces 102, 104 comprise a metallization layer. In the illustrated example, the solderable surface is a metallization layer 700 that may include a sacrificial metallization layer 701, a transition layer 703 and a reactive layer 706. On the die side, reactive layer 706 comprises a metal that bonds with the Silicon substrate or other semiconductor material used to form the substrate. For example, in some embodiments a reactive metal such as titanium is used as it forms a chemical bond with the Silicon material of the die. Other reactive materials can be used, including, for example, titanium/tungsten or chromium.

Transition layer 703 can comprise one or more layers of metals used to create a solderable surface bonded to the reactive layer. Metals such as nickel or cobalt are ideal candidates as they bond well with solder materials used for the STIM such as, for example, Indium. Because these materials passivate (e.g, an exposed nickel surface passivates with a NiO layer), their solderability is reduced with exposure to oxygen. This naturally forming passivation layer reduces the solderability of the metallization layer 700.

Accordingly, a sacrificial metallization layer 701 is disposed on transition layer 703 to prevent formation of the passivation layer. In various embodiments, this sacrificial metallization layer 701 is typically a precious metal such as gold or silver.

Particularly, in one embodiment sacrificial metallization layer 701 is a layer of silver. Silver is chosen because it not only inhibits passivation, but it also forms a eutectic alloy with indium. Therefore, when liquid indium from the solder TIM contact the silver, it wets and dissolves the silver. Accordingly, the leaching of the silver allows the indium to solder to the underlying nickel. The result is a solder joint in which the solder is bonded directly to the nickel with the brittle layer of $In_2Au$ intermetallic compound formed when gold is used as the sacrificial metallization layer 701. The resultant indium-nickel solder joint is highly stable with a slow-growing intermetallic layer. This structure can be used with a STIM for fluxless soldering to form a robust solder thermal interface capable of remaining substantially void-free through multiple reflow operations.

For multiple reflow applications, the silver metallization on the heat spreader also provides a reservoir of filler for the bond line. The liquid indium in contact with silver is initially seeks to form the In—Ag intermetallic compound. This is quickly dissolved in the indium, lowering its melting point to from 157° C. to the In—Ag eutectic of 143° C. This low melting eutectic assists in spreading the wetted surface and provides a mobile source of liquid solder during each melting cycle.

In the formic acid environment, the silver oxide tarnish that accumulates is reduced to a state that can be soldered readily. The properties of the silver layer are such that formic vapor dissociates the surface oxide layer on the metal. Also, indium dissolves the material in a eutectic reaction (thus lowering the melting point of the reacted metal and improving wetting). The dissolving silver metallization can be applied to both interfaces for optimal bonding. However, the lid surface is the more critical one. On that surface, a reservoir of solder forms to fill the bond line on subsequent reflows. This reservoir is supported by the wetting of the solder to silver interface.

A similar reaction occurs in the gold metallized interface; except that indium doesn't dissolve in the gold and instead forms a very stable Au—In intermetallic compound. This coarse, blocky, brittle Au—In intermetallic compound remains lodged at the interface and forms the weakest link of the interface joint. In the gold metallized assemblies, the solder forms a boundary of $AuIn_2$ intermetallic, which has a solution temperature much higher than the soldering temperature. This acts as dam preventing the solder from expanding outward. Excess metal in the bond line bulges out of the joint and eventually forms a droplet, which spills on to the substrate. This volume of metal is lost to the bond line for subsequent melting cycles.

With the gold sacrificial metallization, indium only wets to the original edge of the solder shape. Any excess indium flows out of the interface and spills over the edge of the chip. In the inspection images (FIG. 8), this appears as a tongue of metals. The volume lost in this spillage is not available for conforming to the movement of the interface during the reflow operations. Any additional metal disturbed from the interface adds to the spill for each thermal cycle.

The pool of liquid solder that forms at the edge of the silver metallized interface is actively wetting the silver with the lower melting eutectic alloy present at the leading edge of the interface. With this area larger than the die, a controlled volume of liquid solder is available to flow back into the bond line as the gap opens due to the thermal cycle. Without the reservoir, this opening can lead to formation of a void, or enlargement of an existing void in the bond line.

Tin, zinc and cadmium are also metal coatings forming terminal eutectic in the indium-rich liquid. From a practical standpoint each of these may be less desirable than silver for sacrificial metallization layer 701. The tin eutectic is 118° C. which is too low for most applications of lidded processors. Typically, the bake-out drying temperature is above this melting point. Zinc is too reactive to have its oxide reduced by the forming gas, and Cadmium is less desirable for environmental reasons.

Gold, platinum and palladium are possible metallization layers for soldering because they are immune to environmental effects. These metallizations are routinely used for soldering, including indium alloy soldering. However, the common property of each metallization is the limited solubility in molten indium—the terminal eutectic composition is essentially pure liquid indium. In contrast, when used with tin solder, each of these metallization form a eutectic with at least 0.5% of the metallization in solution. This is similar to the indium-silver eutectic that forms at 3% silver. This eutectic lowers the melting point of indium to 143° C.

In the indium-silver solder joint, the silver dissolves in the liquid metal, lowering the melting point while the silver dissolves. Provided the silver layer is thin compared to the indium, silver will dissolve and allow indium liquid to contact the nickel transition layer. Typically the silver layer would be in the range of thickness from a minimum required for uniform or substantially uniform coverage (on the order of about 0.1 um) to a maximum of ~3% of the thickness of the indium (to remain below the eutectic composition). Typical indium solder thicknesses would be in the 100-300 um range. Because the silver is dissolved, the stable In—Ni intermetallic interface is formed. This is a stable interface since the nickel solubility in indium is negligible.

This process is related to transient liquid phase soldering in that both processes rely on completely dissolving metallization with a high melting point into a low melting point solder metal. In the TLP process, the object is dissolving enough elemental silver in the indium to reach a composition of the Ag—In intermetallic (25-50% Ag) with a melting point of 670° C. In the present application, a low temperature connection is desired. The object is to dissolve less than 3% silver to keep the composition on the indium side of the eutectic.

This silver metallization creates a highly wetted surface—the indium forms a very low angle bond)(<5°) on the silver surface. This affinity of the indium for the silver encourages the indium to wet toward the edge of the metallization with successive thermal cycles. The region between the edge of the metallization and the edge of the integrated circuit chip creates a reservoir of solder for accommodating the flexing of the chip in the subsequent reflow operations.

FIG. 8 provides ultrasonic images comparing silver and gold sacrificial metallization layers. As shown in 801, overflow spillage results when gold is used as the sacrificial metallization layer on the heat spreader. In contrast, image 802 shows reservoir spreading with the silver as the sacrificial metallization layer.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for attaching a heat spreader to a die, comprising:
    disposing a solder thermal interface material between a first surface of a die and a first surface of a heat spreader without disposing a liquid flux between the die and the heat spreader to form an assembly, wherein at least one of the first surface of the die and the first surface of the heat spreader have disposed thereon a metallization structure comprising a transition layer and a sacrificial metallization layer, the sacrificial metallization layer disposed as an outer layer to the metallization structure adjacent the solder thermal interface material; and
    heating the assembly in the presence of an inert oxide reducing gas under a first temperature profile to melt the solder thermal interface material thereby attaching the die to the heat spreader to form a soldered assembly, wherein the sacrificial metallization layer comprises a first metal soluble in the solder thermal interface material to form a eutectic composition with a second metal in the solder thermal interface material and create a package capable of undergoing subsequent reflow processes at equal or elevated temperature profiles.

2. The method of claim 1, wherein the step of heating the assembly takes place in a reflow oven, and further comprising:
    purging the reflow oven with an inert gas prior to the step of heating the assembly; and
    introducing the oxide reducing gas into the purged reflow oven prior to the step of heating the assembly.

3. The method of claim 1, wherein a metallization structure is provided on both the first surface of a die and a first surface of a heat spreader.

4. The method of claim 1, wherein the solder thermal interface material comprises indium and during the heating step the first metal dissolves in the indium, forming a eutectic of lower melting point than the indium.

5. The method of claim 1, wherein the solder thermal interface material comprises indium and during the heating step the indium melts and the first metal dissolves in the melted indium, allowing the melted indium to contact the transition layer.

6. The method of claim 5, wherein the indium forms an intermetallic interface with the transition layer.

7. The method of claim 6, wherein the transition layer comprises a metal having low solubility in indium such that the intermetallic interface formed is a stable intermetallic interface.

8. The method of claim 1, wherein the solder thermal interface material comprises indium and the first metal comprises silver, and during the heating step the silver dissolves in the indium, forming a eutectic of lower melting point than the indium.

9. The method of claim 1, wherein the solder thermal interface material comprises indium, the first metal comprises silver, and the transition layer comprises nickel, and during the heating step the indium melts and the silver dissolves in the melted indium, allowing the melted indium to contact the nickel and forming an In—Ni intermetallic interface.

10. The method of claim 1, wherein the first metal comprises at least one of silver, tin, zinc and cadmium.

11. The method of claim 1, wherein the transition layer comprises at least one of nickel and cobalt.

12. The method of claim 1, wherein the die has a perimeter and the metallization structure extends beyond the perimeter of the die to provide a reservoir of adherent material for reflow operations.

13. The method of claim 1, wherein the inert oxide reducing gas comprises a mixture of an organic acid in an oxygen-free carrier gas.

14. The method of claim 13, wherein the organic acid comprises acetic, formic or other carboxylic forms.

15. The method of claim 1, further comprising subjecting the assembly to a plurality of subsequent reflow processes, the plurality of subsequent reflow processes having higher temperature profiles than the first temperature profile.

16. The method of claim 1, further comprising mounting the soldered assembly on a circuit board and reflow soldering the soldered assembly to the printed circuit board.

17. The method of claim 1, further comprising mounting the soldered assembly on a circuit board and reflow soldering the soldered assembly to the printed circuit board wherein the reflow soldering is performed using a higher temperature profile than the first temperature profile.

18. The method of claim 1, further comprising:
    attaching the spreader to the substrate using a lid seal cure process; and
    applying a force to the spreader during the curing process, and
    wherein the solder preform has a predetermined thickness to provide a desired bondline or standoff height that is substantially the same as a finished bondline after reflow.

19. The method of claim 18, wherein the force is applied using a weight or a clip.

20. The method of claim 18, wherein the lid seal cure process does not hermetically seal the solid volume of solder.

21. The method of claim 1, wherein the a metallization layer on the heat spreader lacks a sacrificial metal layer.

22. The method of claim 1, further comprising inserting a fixture between the heat spreader and the die to maintain a predetermined standoff height during the step of reflow soldering.

23. The method of claim 22, further comprising forcing the heat spreader towards the die during the step of reflow soldering.

24. The method of claim 1, wherein the solid volume of solder has a textured surface adjacent to the heat spreader or the die.

25. The method of claim 1, wherein the solder thermal interface material comprises a first textured surface adjacent to the heat spreader and a second textured surface adjacent to the die.

26. The method of claim 1, wherein the solder thermal interface material is one of a plurality of solder thermal interface materials arranged between the die and the heat spreader and spaced apart by at least one channel.

27. The method of claim 1, wherein the solder thermal interface material comprises a plurality of slits extending from the center of the volume toward the periphery of the volume, wherein the slits are configured to close during the reflow solder process without forming voids.

28. The method of claim 1, further comprising not cleaning the soldered assembly prior to a subsequent reflow application.

29. The method of claim 1, wherein the first temperature profile includes a temperature sufficient to decompose an oxide reducing gas.

30. A soldered die and heat spreader assembly made by a process comprising the steps of:
 disposing a solder thermal interface material between a first surface of a die and a first surface of a heat spreader without disposing a liquid flux between the die and the heat spreader to form an assembly, wherein at least one of the first surface of the die and the first surface of the heat spreader have disposed thereon a metallization structure comprising a transition layer and a sacrificial metallization layer, the sacrificial metallization layer disposed as an outer layer to the metallization structure adjacent the solder thermal interface material; and
 heating the assembly in the presence of an inert oxide reducing gas under a first temperature profile to melt the solder thermal interface material thereby attaching the die to the heat spreader to form a soldered assembly, wherein the sacrificial metallization layer comprises a first metal soluble in the solder thermal interface material to form a eutectic composition with a second metal in the solder thermal interface material and create a package capable of undergoing subsequent reflow processes at equal or elevated temperature profiles;
 wherein the solder thermal interface material comprises indium, the first metal comprises silver, and the transition layer comprises nickel, and during the heating step the indium melts and the silver dissolves in the melted indium, allowing the melted indium to contact the nickel and forming an In—Ni intermetallic interface.

31. The soldered die and heat spreader assembly of claim 30, wherein the step of heating the assembly takes place in a reflow oven, and further comprising:
 purging the reflow oven with an inert gas prior to the step of heating the assembly; and
 introducing the oxide reducing gas into the purged reflow oven prior to the step of heating the assembly.

32. The soldered die and heat spreader assembly of claim 30, wherein when the silver dissolves in the indium, a eutectic of lower melting point than the indium is formed.

33. A soldered die and heat spreader assembly made by a process comprising the steps of:
 disposing a solder thermal interface material between a first surface of a die and a first surface of a heat spreader without disposing a liquid flux between the die and the heat spreader to form an assembly, wherein at least one of the first surface of the die and the first surface of the heat spreader have disposed thereon a metallization structure comprising a transition layer and a sacrificial metallization layer, the sacrificial metallization layer disposed as an outer layer to the metallization structure adjacent the solder thermal interface material; and
 heating the assembly in the presence of an inert oxide reducing gas under a first temperature profile to melt the solder thermal interface material thereby attaching the die to the heat spreader to form a soldered assembly, wherein the sacrificial metallization layer comprises a first metal soluble in the solder thermal interface material to form a eutectic composition with a second metal in the solder thermal interface material and create a package capable of undergoing subsequent reflow processes at equal or elevated temperature profiles;
 wherein the solder thermal interface material comprises indium and during the heating step the indium melts and the first metal dissolves in the melted indium, allowing the melted indium to contact the transition layer; and
 wherein the indium forms an intermetallic interface with the transition layer and wherein the transition layer comprises a metal having low solubility in indium such that the intermetallic interface formed is a stable intermetallic interface.

34. The soldered die and heat spreader assembly of claim 33, wherein the first metal comprises silver, and during the heating step the silver dissolves in the indium, forming a eutectic of lower melting point than the indium.

35. The soldered die and heat spreader assembly of claim 30, wherein the die has a perimeter and the metallization structure extends beyond the perimeter of the die to provide a reservoir of adherent material for reflow operations.

36. The soldered die and heat spreader assembly of claim 33, wherein the step of heating the assembly takes place in a reflow oven, and further comprising:
 purging the reflow oven with an inert gas prior to the step of heating the assembly; and
 introducing the oxide reducing gas into the purged reflow oven prior to the step of heating the assembly.

37. The soldered die and heat spreader assembly of claim 33, wherein the die has a perimeter and the metallization structure extends beyond the perimeter of the die to provide a reservoir of adherent material for reflow operations.

* * * * *